(12) United States Patent
Somachudan et al.

(10) Patent No.: US 9,024,650 B2
(45) Date of Patent: May 5, 2015

(54) SCALABLE BUILT-IN SELF TEST (BIST) ARCHITECTURE

(71) Applicant: Advanced Micro Devices, Inc., Sunnyvale, CA (US)

(72) Inventors: Archana Somachudan, Austin, TX (US); Atchyuth K. Gorti, Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 274 days.

(21) Appl. No.: 13/675,704

(22) Filed: Nov. 13, 2012

(65) Prior Publication Data

US 2014/0132291 A1    May 15, 2014

(51) Int. Cl.
  *G01R 31/3187*    (2006.01)
  *G01R 31/317*    (2006.01)

(52) U.S. Cl.
  CPC ...... *G01R 31/3187* (2013.01); *G01R 31/31724* (2013.01)

(58) Field of Classification Search
  CPC .... G11C 29/4401; G11C 29/00; G11C 29/02; G11C 29/14; G11C 29/10; G11C 29/38; G11C 29/44; G01R 31/3187; G01R 31/2853; G01R 31/318536; G01R 31/31855; G01R 31/3167; G01R 31/31718; G01R 31/318513; G01R 31/2843; G01R 31/311; G01R 31/31717; G01R 31/31724; G01R 31/318555; G06F 11/1048; G06F 11/221; G06F 13/4004; G06F 17/505; H01L 2225/06541; H01L 2225/06596; H01L 25/0657; H03K 3/0375; H03K 2005/00052
  See application file for complete search history.

(56) References Cited

U.S. PATENT DOCUMENTS

| | | | |
|---|---|---|---|
| 5,748,640 A | 5/1998 | Jiang et al. | |
| 5,961,653 A | 10/1999 | Kalter et al. | |
| 7,653,845 B2 | 1/2010 | Hesse et al. | |
| 7,844,867 B1 | 11/2010 | Reddy et al. | |
| 7,869,293 B2 | 1/2011 | Morein | |
| 8,639,994 B2* | 1/2014 | Chen et al. | 714/733 |
| 2007/0271482 A1* | 11/2007 | Doddamane et al. | 714/30 |

* cited by examiner

*Primary Examiner* — Vinh Nguyen
(74) *Attorney, Agent, or Firm* — Polansky & Associates, P.L.L.C.; Paul J. Polansky

(57) ABSTRACT

A circuit with built-in self test (BIST) capability includes a master BIST controller, a plurality of slave BIST controllers, and a collector. The master BIS controller issues test instructions in response to a master resume input signal. The plurality of slave BIST controllers is coupled to the master BIST controller. Each slave BIST controller is adapted to perform a test on a functional circuit in response to a test instruction and to provide a resume signal at a conclusion of the test. The collector receives a corresponding resume signal from each of the multiple slave BIST controllers after the master BIST controller issues the test instruction, and subsequently provides the master resume signal in response to an activation of all of the corresponding resume signals.

24 Claims, 4 Drawing Sheets

SCALABLE BUILT-IN SELF TEST (BIST) ARCHITECTURE

FIELD

This disclosure relates generally to test circuits, and more specifically to built-in self test circuits.

BACKGROUND

Testing the operation of an integrated circuit and determining that it is operating as desired has become increasingly difficult as integrated circuit complexity has increased. Adequate testing frequently requires the testing of internal circuits that are not directly accessible from the device's terminals. One technique for testing internal circuits is known as boundary scan, defined as a standard by the Joint Test Action Group (JTAG). Boundary scan is especially useful for testing complex digital logic buried deep within complex integrated circuits such as microprocessors. Another testing method, known as built-in self test (BIST), is useful for faster, at-speed testing of circuits with large, regular structures such as integrated circuit memories. BIST uses a small controller circuit on the chip to carry out tests on command and to provide the results to an external agent. BIST enables faster testing of large on-chip memory structures at the expense of additional area and power costs for on-chip test logic. The architecture for memory BIST logic should enable the at-speed testing of the on-chip memories while making acceptable tradeoffs between power and chip area.

For example, many modern microprocessors include two or more CPU cores, each including a dedicated level 1 (L1) cache memory and a shared or dedicated level 2 (L2) cache memory. Since the L2 cache memory is large and regular, it is an excellent candidate for testing using the BIST method. Moreover to reduce test time and to enable optimal use of chip area for test purposes, the BIST logic can be distributed by separating the controller into a master BIST controller, which provides test instructions and data patterns, and several slave BIST controllers that execute the test on an adjacent portion of the L2 cache memory. The slave BIST controllers are customized for the corresponding circuits under test while the master BIST controller can service multiple slave BIST slave controllers.

BRIEF DESCRIPTION OF THE DRAWINGS

FIG. 1 illustrates in block diagram form a BIST circuit known in the prior art.

FIG. 2 illustrates in block diagram form a circuit with BIST capability according to some embodiments.

FIG. 3 illustrates in block diagram form a BIST circuit according to some embodiments.

FIG. 4 illustrates in schematic form a collector that may be used in the BIST circuit of FIG. 3 according to some embodiments.

FIG. 5 illustrates a timing diagram useful in understanding the operation of the collector of FIG. 4 according to some embodiments.

FIG. 6 illustrates a flow diagram of a method of BIST according to some embodiments.

In the following description, the use of the same reference numerals in different drawings indicates similar or identical items. Unless otherwise noted, the word "coupled" and its associated verb forms include both direct connection and indirect electrical connection by means known in the art, and unless otherwise noted any description of direct connection implies alternate embodiments using suitable forms of indirect electrical connection as well.

DETAILED DESCRIPTION OF ILLUSTRATIVE EMBODIMENTS

Generally, a master BIST controller for a circuit with built-in self test is capable of issuing test instructions to one or more slave BIST controllers that each perform a test on a functional circuit. As the slave BIST controller completes execution of each set of test instructions in the test algorithm, the slave BIST controller generates a BIST resume signal to the master BIST controller that tells the master BIST controller to provide the next set of instructions in the test algorithm and at the conclusion of the test, each slave BIST controller provides the test results to the master BIST controller. When the master BIST controller and the slave BIST controllers are connected in a distributed configuration subject to different latencies or delays between the master BIST controller and each of the slave BIST controllers, test instructions issued by the master BIST controller reach each of the slave BIST controllers at different times and consequently the test results from the different slave BIST controllers reach the master BIST controller in a staggered manner. A collector for a circuit with BIST capability as disclosed below, however, receives the resume signals from each slave BIST controller and provides a master resume signal to the master BIST controller after each of the slave BIST controllers has activated its own resume signal. The master BIST controller is able to properly transition from a current BIST state to the next BIST state, and rapidly issues the next group of test instructions to the slave BIST controllers. In this way, the collector facilitates shorter test times and provides the master resume signal using a clean handshake protocol that operates as a function of accurate completion times of each of the slave BIST controllers rather than estimated, padded, or assumed test completion times. By collecting signals indicating test completions that arrive at variable times, the BIST circuit provides a scalable architecture to allow for the addition of slave controllers to accommodate changes in process technology or cache architectures without significant redesign.

FIG. 1 illustrates in block diagram form a BIST circuit 100 known in the prior art. BIST circuit 100 generally includes a master BIST controller 110 and slave BIST controllers 120, 130, 140, and 150. Master BIST controller 110 is connected to slave BIST controllers 120, 130, 140, and 150.

In operation, master BIST controller 110 generally provides test instructions and test data to slave BIST controllers 120-150. In response, slave BIST controllers 120-150, located close to or within associated functional circuits, configure the functional circuit for test. When enabled by master BIST controller 110, slave BIST controllers 120-150 run the BIST, using the test data, on the functional blocks. At the completion of a test, or a group of tests, each of slave BIST controllers 120-150 individually communicate test results to master BIST controller 110.

By distributing slave BIST controllers 120-150 among multiple functional circuits, master BIST controller 110 operates to reduce test time by directing a slave BIST controller to test an associated functional circuit, or by directing multiple slave BIST controllers 120-150 to concurrently test associated multiple functional circuits. However, each of slave BIST controllers 120-150 generally communicate completed test information with master BIST controller 110 at different times, generally unknown by master BIST controller 110. Each of slave BIST controllers 120-150 are typically running a different length test, and each experiences a different path delay to communicate with master BIST controller 110.

For each variation of circuit configuration, layout topology, process technology, and so on, of BIST circuit 100, master BIST controller 110 and slave BIST controllers 120-150 operate with different electrical characteristics. For example, the propagation delay required for master BIST controller 110 to send a test pattern to slave BIST controller 120 will be different for each variation of circuit configuration. Also, the propagation delay for each slave BIST controller to send test results, data, control signals, and a resume signal to master BIST controller 110 will be different for each variation of circuit configuration. For example, the time required to properly test cache memory can vary widely as a function of the cache size and the number of slave BIST controllers running the tests.

For BIST circuit 100, master BIST controller 110 lacks an efficient protocol to determine when particular slave BIST controllers have completed particular tests, when all slave BIST controllers 120-150 have communicated test results, and when to resume so all slave BIST controllers 120-150 properly receive the next group of test instructions. As a result, master BIST controller 110 is susceptible to making improper transitions between BIST states, resulting in prolonged, costly, or erroneous testing of the functional circuits.

Figure 1:
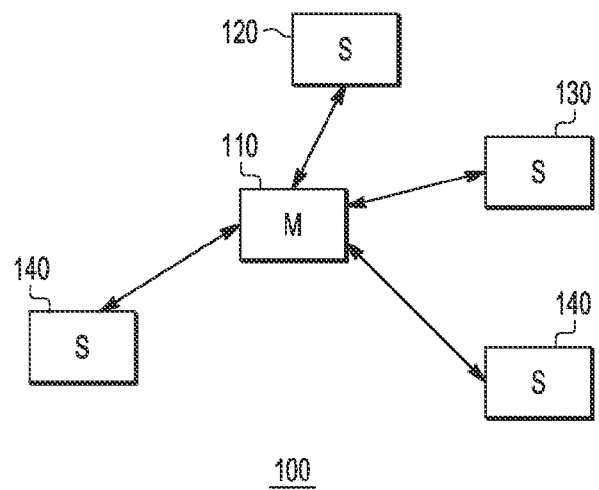
Figure 2:
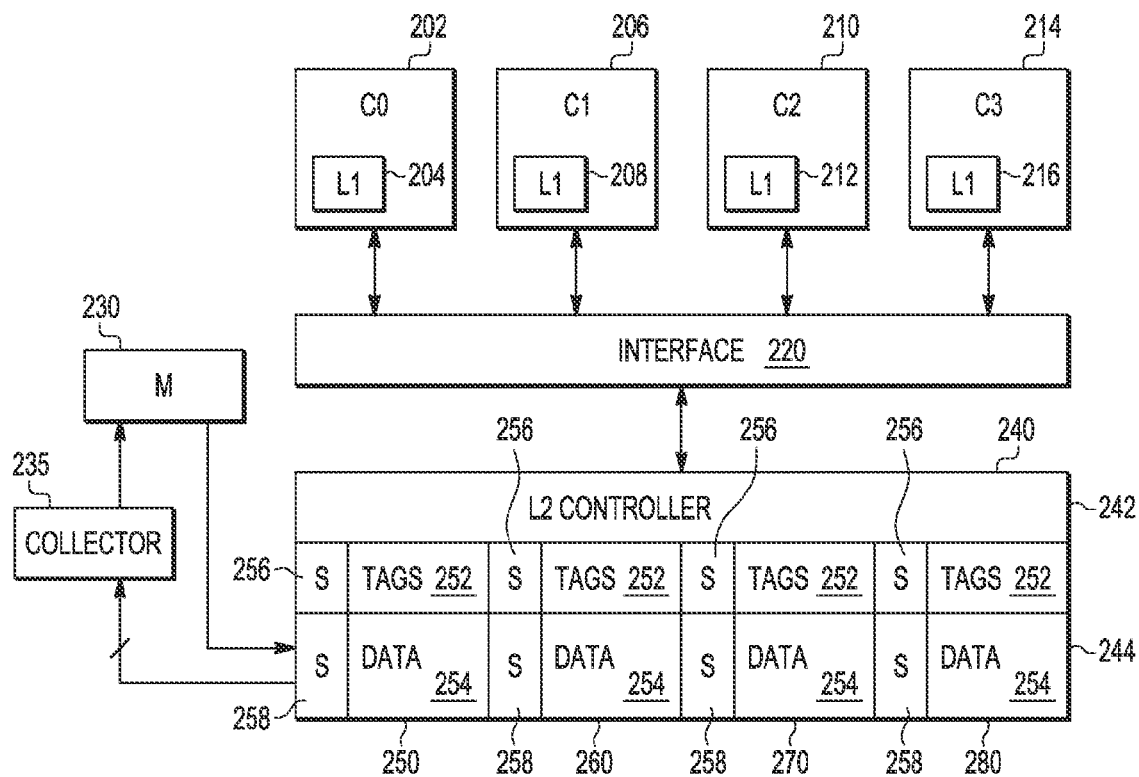

FIG. 2 illustrates in block diagram form a circuit 200 with BIST capability according to some embodiments. Circuit 200 is a microprocessor and generally includes central processing unit (CPU) cores 202 labeled "C0", 206 labeled "C1", 210 labeled "C2", and 214 labeled "C3", an interface 220, a master BIST controller 230, a collector 235, and a shared L2 cache 240. Each one of CPU cores 202, 206, 210, and 214 includes a respective one of level one (L1) caches 204, 208, 212, and 216 and is connected to interface 220.

Master BIST controller 230 has an input and an output. Collector 235 has an input, and an output connected to the input of Master BIST controller 230. Shared L2 cache 240 includes a cache controller 242, and multiple memory banks 244 including banks 250, 260, 270, and 280. Each one of memory banks 244 includes a functional circuit 252 which is a tags array, a functional circuit 254 which is a data array, a slave BIST controller 256 for functional circuit 252 (tags array), and a slave BIST controller 258 for functional circuit 254 (data array). Cache controller 242 is connected to CPU cores 202, 206, 210, and 214 through interface 220. In some embodiments, slave BIST controllers 256 and 258 are connected in a daisy chain configuration to master BIST controller 230.

CPU cores 202-214 each have the capability to execute a common instruction set including instructions that access data. L1 caches 204-216 each represent the first cache accessed by each one of cores 202-214, respectively, when an instruction or block of data is accessed. In circuit 200, each of L1 caches 204-216 is a combined instruction and data cache.

In a normal mode, CPU cores 202-214 communicate instructions and associated data with interface 220. Interface 220 manages communication between CPU cores 202-214 and shared L2 cache 240. Within each of multiple memory banks 244, L2 cache controller 242 stores multiple cache lines in a memory array, including multiple functional circuits 252 (tags array) corresponding to the multiple cache lines, and functional circuit 254 (data array). If an access misses in one or more of L1 caches 204-216, the associated L1 cache 204-216 checks shared L2 cache 240, since shared L2 cache 240 is the next lower level of the memory hierarchy.

Interface 220 also manages communication between CPU cores 202-214 and L2 cache controller 242 in a BIST mode.

In some embodiments, master BIST controller 230 manages multiple slave BIST controllers 256 and 258 through a daisy chain configuration. Each of slave BIST controllers 256 and 258 are associated with one of multiple memory banks 244 to perform a test of functional circuits 252 and 254, in response to the test instructions. After master BIST controller 230 issues the test instructions, collector 235 receives a corresponding resume signal from each of slave BIST controllers 256 and 258, and subsequently provides a master resume signal to master BIST controller 230 in response to all slave BIST controllers 256 activating their corresponding resume signals. After receiving the master resume signal, master BIST controller 230 can perform further action such as issuing a subsequent BIST command.

Figure 3:
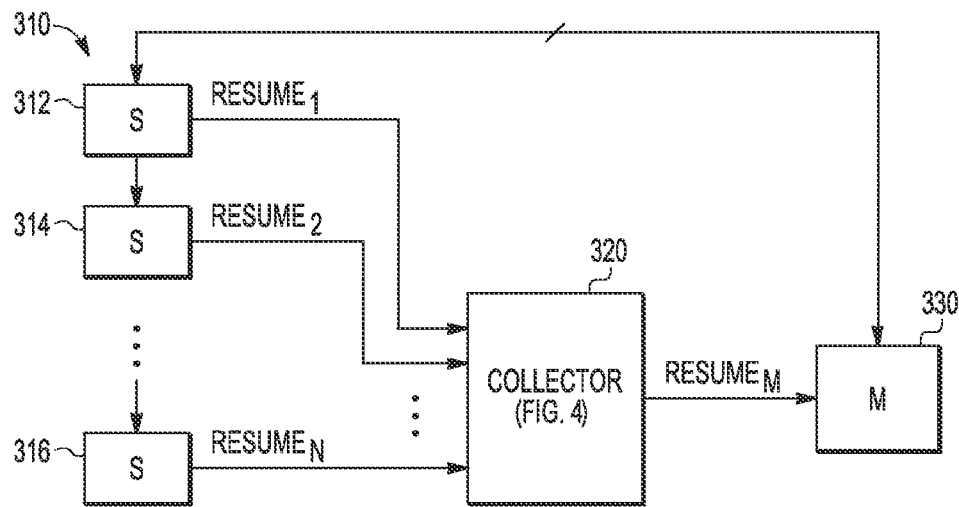

FIG. 3 illustrates in block diagram form a BIST circuit 300 according to some embodiments. BIST circuit 300 generally includes multiple slave BIST controllers 310 including example slave BIST controllers 312, 314, and 316, a collector 320, and a master BIST controller 330.

Each one of slave BIST controllers 312, 314, and 316 has an input, and an output to provide signals labeled "RESUME$_1$", "RESUME$_2$", and "RESUME$_N$" respectively. Collector 320 has multiple inputs connected to each output of multiple slave BIST controllers 310, and an output to provide a signal labeled "RESUME$_M$". Master BIST controller 330 has an input connected to the output of collector 320, and is connected to the input of slave BIST controller 312. In some embodiments, slave BIST controllers 312-316 are connected in a daisy chain configuration to receive an instruction from master BIST controller 330 that has been passed through the daisy chain.

In operation, each of multiple slave BIST controllers 310 communicates with master BIST controller 330 through the daisy chain configuration. Master BIST controller 330 issues test instructions and test data to slave BIST controllers 312-316 and slave BIST controllers 312-316 perform test operations. Slave BIST controllers 312-316 provide RESUME$_1$, RESUME$_2$, and RESUME$_N$, respectively, to collector 320 after completing their test instruction. Since each of slave BIST controllers 310 starts their test operation at different times, they provide RESUME$_1$-RESUME$_N$ to collector 320 at different times. After collector 320 has collected all RESUME$_1$-RESUME$_N$ signals, collector 320 provides an active master RESUME$_M$ signal to master BIST controller 330. In response, master BIST controller 330 properly transitions from a current BIST state to the next BIST state, and rapidly issues the next group of test instructions to slave BIST controllers 312-316.

Figure 4:
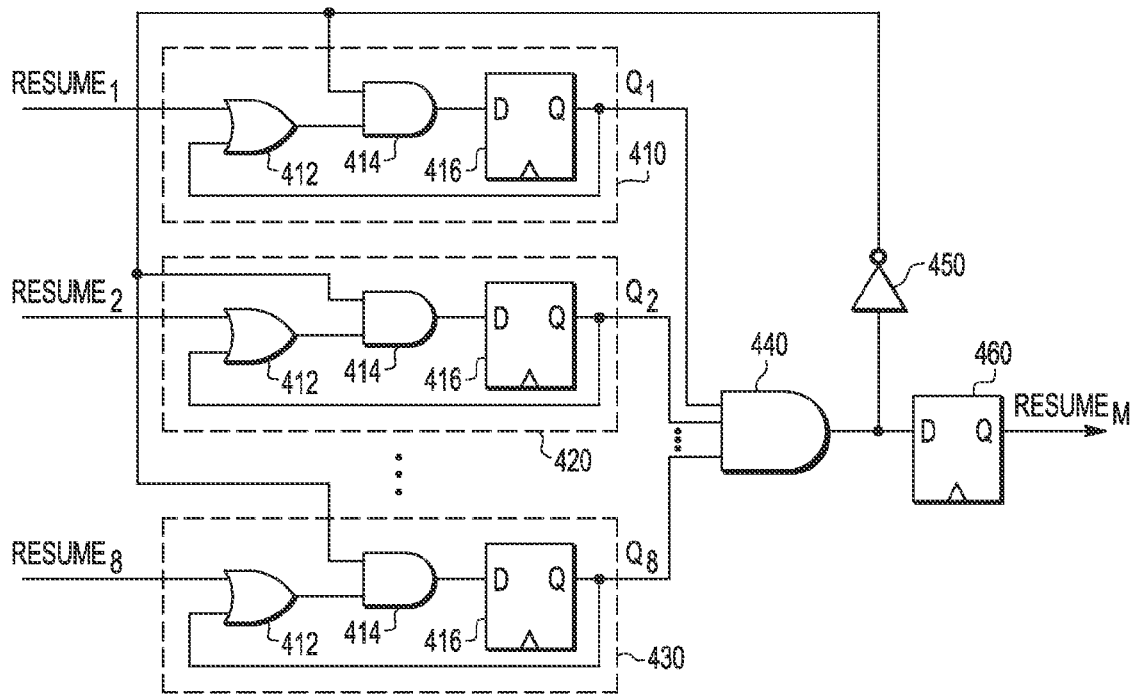

FIG. 4 illustrates in schematic form a collector 320 that may be used in BIST circuit 300 of FIG. 3 according to some embodiments. Collector 320 generally includes a set of sticky latches including example sticky latches 410, 420, and 430, a logic gate 440 which is an AND gate, an inverter 450, and an output latch 460 which is an edge triggered flip-flop. Sticky latches 410, 420, and 430 each include an OR gate 412, an AND gate 414, and a resume latch 416 which is an edge triggered flip-flop.

In each of sticky latches 410, 420, and 430, a corresponding OR gate 412 has a first input to receive RESUME$_1$, RESUME$_2$, and RESUME$_8$, respectively, a second input, and an output. AND gate 414 has a first input, a second input connected to the output of OR gate 412, and an output. Resume latch 416 has a D input connected to the output of AND gate 414, a clock input, and a Q output connected to the second input of OR gate 412 for providing signals labeled "Q$_1$", "Q$_2$", and "Q$_8$" respectively.

Logic gate 440 is scalable, and has multiple inputs including inputs to receive $Q_1$, $Q_2$, and $Q_8$, and an output. Inverter 450 has an input connected to the output of logic gate 440, and an output connected to the first input of each AND gate 414. Output latch 460 has a D input connected to the output of logic gate 440, a clock input, and a Q output to provide signal $RESUME_M$.

In operation, each of slave BIST controllers 310 provides $RESUME_1$-$RESUME_8$ pulses to sticky latches 410-430, respectively. Each of sticky latches 410-430 latches the state of the corresponding RESUME pulse in resume latch 416 to provide sticky resume signals $Q_1$-$Q_8$, respectively, to logic gate 440. Also, each of sticky latches 410-430 feedback $Q_1$-$Q_8$, respectively, through OR gate 412 and AND gate 414 to update the current state of each of sticky latches 410-430 in resume latch 416 on each clock edge (not shown). Each of sticky latches 410-430 maintains its respective Q output signal even after the RESUME pulse is no longer asserted until reset.

At certain times, each of slave BIST controllers 310 complete their associated test instruction and provide an active $Q_1$-$Q_8$ sticky resume signal to logic gate 440. When all of slave BIST controllers 310 have completed their associated BIST instruction, logic gate 440 provides an active signal to the D input of output latch 460. In response, output latch 460 provides an active master $RESUME_M$ signal to master BIST controller 330. Also, inverter 450 provides an active reset signal to deactivate sticky latches 410-430. In response, master BIST controller 330 transitions to a next state to provide the next test instructions to each of slave BIST controllers 310. Collector 320 collects subsequent pulses of $RESUME_1$-$RESUME_8$ after master BIST controller 230 issues subsequent test instructions.

By distributing slave BIST controllers among multiple functional circuits, master BIST controller 330 operates to reduce test time by directing at least one of slave BIST controllers 310 to test certain functional circuits, or by directing multiple slave BIST controllers 310 to concurrently test multiple functional circuits. However, unlike BIST circuit 100, each of slave BIST controllers 310 can start and complete tests on command at different points in time while returning a RESUME signal to indicate test completion.

Although each of slave BIST controllers 310 have a different path delay to communicate with collector 320 and may even run a different test sequence, BIST circuit 300 operates with an efficient handshake protocol to determine when all of slave BIST controllers 310 have completed a test instruction. Using collector 320, each of slave BIST controllers 310 communicate timely test results to master BIST controller 110. As a result, master BIST controller 330 properly and rapidly transitions between BIST states, resulting in efficient repeatable testing of functional circuits 252 and 254.

In some embodiments, to reduce the use of routing tracks between master BIST controller 330 and each of slave BIST controllers 310, BIST circuit 300 uses the daisy chain configuration previously described. For each variation of distributed master-slave topology, process technology, and so on, the propagation delay uncertainties for sending test patterns, test results, data, control signals, and individual resume signals between master and slaves can be further exaggerated. Unlike BIST circuit 100, collector 320 provides $RESUME_M$ to master BIST circuit 300 to establish a clean handshake protocol between master BIST controller 330 and each of slave BIST controllers 310.

Also, by providing a master $RESUME_M$ signal using the clean handshake protocol that operates as a function of accurate completion times of each of slave BIST controllers 310, collector 320 facilitates shorter test times for BIST circuit 300 than BIST circuit 100. For example, master BIST controller 330 does not operate based on estimated, padded, or assumed test completion times of slave BIST controllers 310. Thus, the circuitry of collector 320 is scalable for multiple slave BIST controllers 310 and multiple functional circuits under test.

Figure 5:
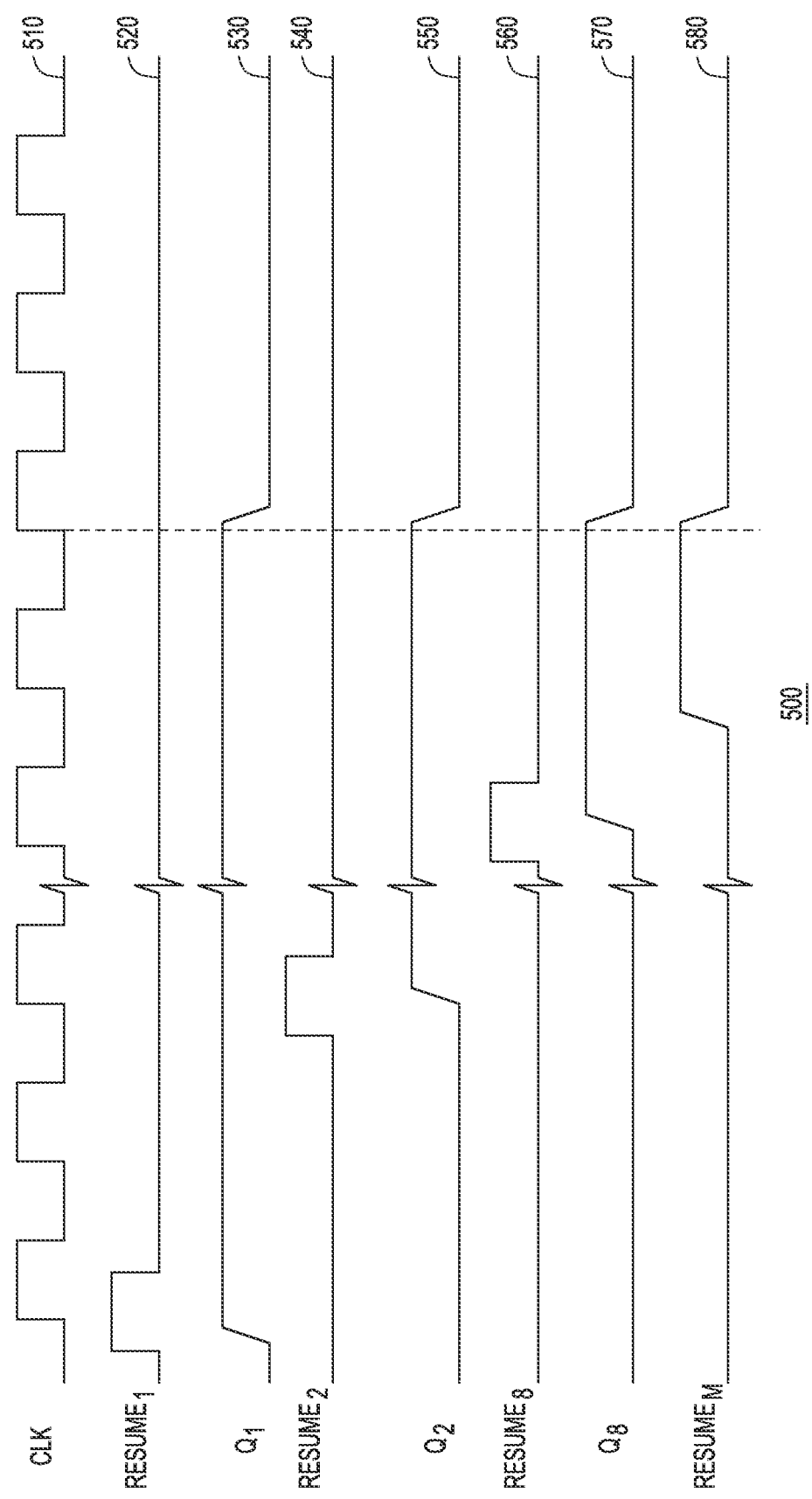

FIG. 5 illustrates a timing diagram 500 useful in understanding the operation of collector 320 of FIG. 4 according to some embodiments. The horizontal axis represents time, and the vertical axis represents amplitude of various signals in volts. The timing diagram illustrates eight waveforms of interest, a clock waveform 510 labeled "CLK", a $RESUME_1$ waveform 520, a $Q_1$ waveform 530, a $RESUME_2$ waveform 540, a $Q_2$ waveform 550, a $RESUME_8$ waveform 560, a $Q_8$ waveform 570, and a $RESUME_M$ waveform 580.

In operation, at various times, each of slave BIST controllers 310 complete their associated test instruction and each provide corresponding active RESUME pulses to sticky latches 410-430. In response, on the next rising edge of CLK (waveform 510), each of sticky latches 410-430 latch and retain an active state of $Q_1$ (waveform 530), $Q_2$ (waveform 550), and $Q_8$ (waveform 570), respectively.

When all of slave BIST controllers 310 have completed BIST testing, and the last slave has provided an active RESUME pulse to collector 320, collector 320 provides an active $RESUME_M$ signal to master BIST controller 330 on the next rising edge of CLK. In FIG. 5, the dashed vertical line indicates the CLK edge at which inverter 450 provides an active reset signal to deactivate $Q_1$, $Q_2$, and $Q_8$ of resume latch 416.

Figure 6:
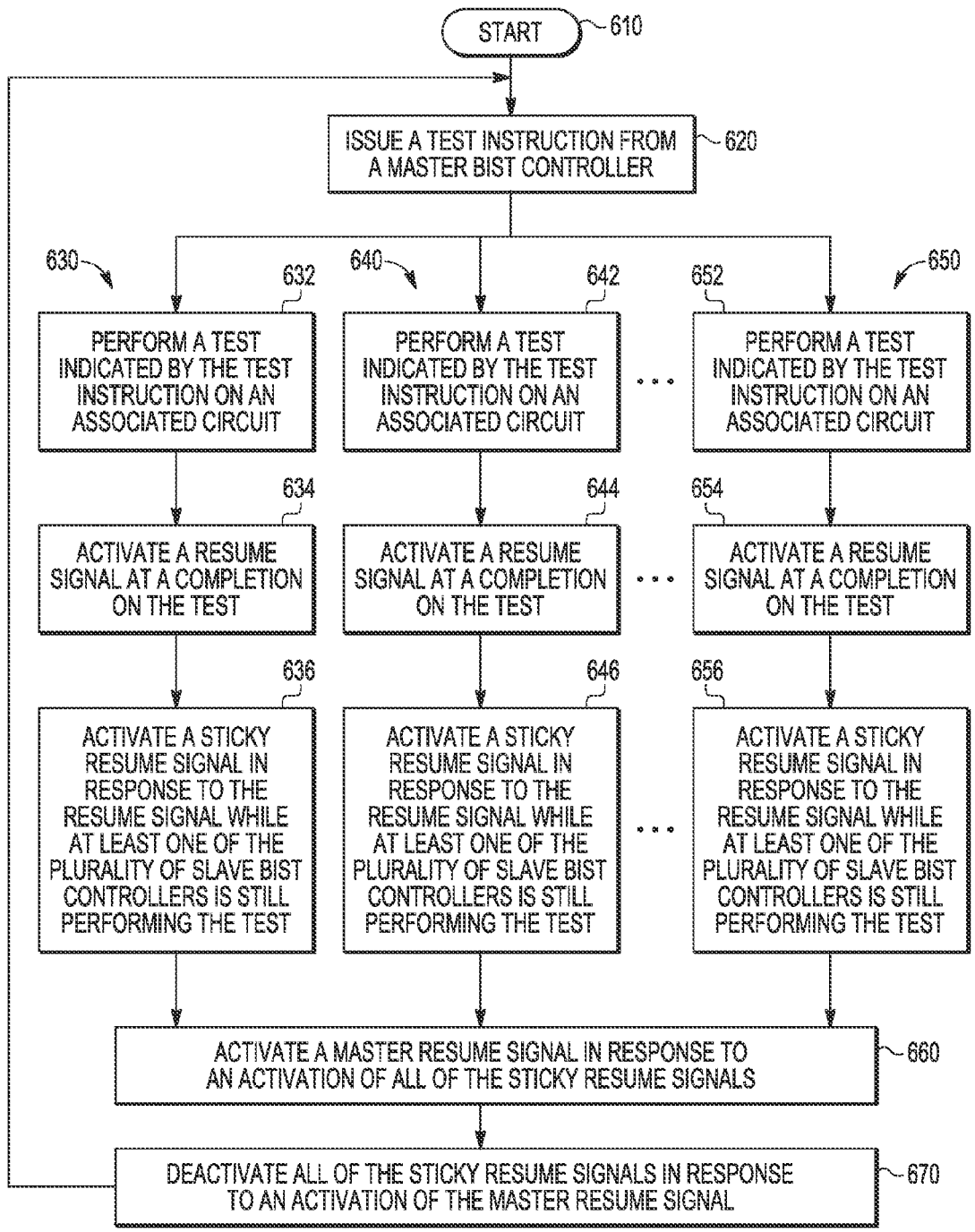

FIG. 6 illustrates a flow diagram of a method 600 of BIST according to some embodiments. Method 600 starts at action oval 610. Action box 620 includes issuing a test instruction from a master BIST controller to three example BIST slave controllers (flow paths 630, 640, and 650). The flow concurrently proceeds to action boxes 632, 642, and 652, which include performing a test indicated by the test instruction on an associated circuit. Action boxes 634, 644, and 654 include activating a RESUME signal at a completion of the test. Action boxes 636, 646, and 656 include activating a sticky resume signal in response to the RESUME signal while at least one of the multiple slave BIST controllers is still performing the test. Action box 660 includes activating a master RESUME signal in response to an activation of all of the sticky resume signals. Action box 670 including deactivating all of the sticky resume signals in response to an activation of the master RESUME signal. The flow proceeds from action box 670 back to action box 620.

The functions of FIGS. 2-4 may be implemented with various combinations of hardware and software, and the software component may be stored in a computer readable storage medium for execution by at least one processor. Moreover the method illustrated in FIG. 6 may also be governed by instructions that are stored in a computer readable storage medium and that are executed by at least one processor. Each of the operations shown in FIG. 6 may correspond to instructions stored in a non-transitory computer memory or computer readable storage medium. In various embodiments, the non-transitory computer readable storage medium includes a magnetic or optical disk storage device, solid state storage devices such as Flash memory, or other non-volatile memory device or devices. The computer readable instructions stored on the non-transitory computer readable storage medium may be in source code, assembly language code, object code, or other instruction format that is interpreted and/or executable by one or more processors.

Thus, a circuit having a scalable BIST architecture includes a master BIST controller and multiple slave BIST controllers for conducting tests on corresponding functional circuits such as data and tag arrays of a large L2 cache memory. The slave BIST controller may be connected to the master BIST controller in a daisy chain configuration, which increases the divergence in test completion times. A collector collects completion pulses and signals an overall completion to the master BIST controller based on receiving completion pulses from all of the slave BIST controllers. In this way, the BIST circuit provides a scalable architecture to allow model changes without significant redesign.

Moreover, the functions of FIGS. 2-4 may be described or represented by a computer accessible data structure in the form of a database or other data structure which can be read by a program and used, directly or indirectly, to fabricate integrated circuits of FIGS. 2-4. For example, this data structure may be a behavioral-level description or register-transfer level (RTL) description of the hardware functionality in a high level design language (HDL) such as Verilog or VHDL. The description may be read by a synthesis tool which may synthesize the description to produce a netlist comprising a list of gates from a synthesis library. The netlist comprises a set of gates which also represent the functionality of the hardware comprising integrated circuits of FIGS. 2-4. The netlist may then be placed and routed to produce a data set describing geometric shapes to be applied to masks. The masks may then be used in various semiconductor fabrication steps to produce integrated circuits of FIGS. 2-4. Alternatively, the database on the computer accessible storage medium may be the netlist (with or without the synthesis library) or the data set, as desired, or Graphic Data System (GDS) II data.

While particular embodiments have been described, various modifications to these embodiments will be apparent to those skilled in the art. For example, in the illustrated embodiments, circuit 200 includes four CPU cores 202, 206, 210, and 214, and four L1 caches 204, 208, 212, and 216. In some embodiments, circuit 200 could include a different number of CPU cores, and different cache memory hierarchies, including shared and dedicated cache memories. CPU cores 202, 206, 210, and 214 could be logic circuits other than CPU cores, and circuit 200 could be a different type of circuit than a microprocessor. CPU cores 202, 206, 210, and 214 could use a common circuit design or different circuit designs. In the illustrated embodiments, each one of slave BIST controllers 256 and 258 and slave BIST controllers 310 are connected to receive an instruction from master BIST controller 230 and master BIST controller 330, respectively, in a daisy chain configuration. In some embodiments, each one of slave BIST controllers 256 and 258 and slave BIST controllers 310 could be connected to receive an instruction from master BIST controller 230 and master BIST controller 330, respectively, using different configurations, for example a point to point configuration from master BIST controller to multiple slave BIST controllers. In the illustrated embodiments, the circuit under test in a large L2 cache, but in some embodiments it could be a different logic circuit such as a GPU, a CPU core, an APU, a memory sub-system, a system controller, a complex peripheral function, and so on. Also, circuit 200, BIST circuit 300, and collector 320, could be formed on a single integrated circuit or could be formed on multiple integrated circuits.

Accordingly, it is intended by the appended claims to cover all modifications of the disclosed embodiments that fall within the scope of the disclosed embodiments.

What is claimed is:

1. A circuit with built-in self test (BIST) capability comprising:
    a master BIST controller for issuing test instructions in response to a master resume input signal;
    a plurality of slave BIST controllers coupled to said master BIST controller, each slave BIST controller adapted to perform a test on a functional circuit in response to a test instruction and to provide a resume signal at a conclusion of said test; and
    a collector for receiving a corresponding resume signal from each of said plurality of slave BIST controllers after said master BIST controller issues said test instruction, and for subsequently providing said master resume signal in response to an activation of all of said corresponding resume signals.

2. The circuit of claim 1, wherein said plurality of slave BIST controllers are coupled to receive said instruction in a daisy chain configuration.

3. The circuit of claim 1, wherein said collector comprises:
    a plurality of sticky latches each having a data input for receiving said corresponding resume signal, and an output for providing a corresponding sticky resume signal;
    a logic gate having a plurality of inputs coupled to said outputs of said plurality of sticky latches, and an output for providing an unlatched master resume signal; and
    an output latch having a data input coupled to said output of said logic gate, and an output for providing said master resume signal.

4. The circuit of claim 3, wherein said logic gate comprises an AND gate.

5. The circuit of claim 3, wherein each of said plurality of sticky latches comprises:
    an OR gate having a first input for receiving said corresponding resume signal, a second input for receiving said corresponding sticky resume signal, and an output;
    an AND gate having a first input for receiving a complement of said unlatched master resume signal, a second input coupled to said output of said OR gate, and an output; and
    a resume latch having a data input coupled to said output of said AND gate, a clock input for receiving said scan clock signal, and an output for providing said sticky resume signal.

6. The circuit of claim 3, wherein said functional circuit of each of said plurality of slave BIST controllers comprises a memory array.

7. A circuit with built-in self test (BIST) capability comprising:
    a plurality of functional circuits;
    a plurality of slave BIST controllers, each slave BIST controller adapted to perform a test on one of said plurality of functional circuits in response to a test instruction and to provide a resume signal at a conclusion of said test;
    a master BIST controller for issuing test instructions in response to a master resume input signal; and
    a collector for receiving a corresponding resume signals from each of said plurality of slave BIST controllers after said master BIST controller issues said test instruction, and for subsequently providing said master resume signal in response to an activation of all of said corresponding resume signals.

8. The circuit of claim 7, wherein each of said plurality of functional circuits comprises:
    a data array for a corresponding portion of a cache; and
    a tag arrays for said data array.

9. The circuit of claim 7, wherein said plurality of slave BIST controllers are coupled to receive said instruction in a daisy chain configuration.

10. The circuit of claim 7, wherein said collector comprises:
   a plurality of sticky latches each having a data input for receiving said corresponding resume signal, and an output for providing a corresponding sticky resume signal;
   a logic gate having a plurality of inputs coupled to said outputs of said plurality of sticky latches, and an output for providing an unlatched master resume signal; and
   an output latch having a data input coupled to said output of said logic gate, and an output for providing said master resume signal.

11. The circuit of claim 10, wherein said logic gate comprises an AND gate.

12. The circuit of claim 10, wherein each of said plurality of sticky latches comprises:
   an OR gate having a first input for receiving said corresponding resume signal, a second input for receiving said corresponding sticky resume signal, and an output;
   an AND gate having a first input for receiving a complement of said unlatched master resume signal, a second input coupled to said output of said OR gate, and an output; and
   a resume latch having a data input coupled to said output of said AND gate, a clock input for receiving said scan clock signal, and an output for providing said sticky resume signal.

13. The circuit of claim 7, wherein each of said functional circuits comprises a memory array.

14. A microprocessor with built-in self test (BIST) capability comprising:
   a plurality of central processing unit cores;
   a shared cache coupled to and shared by said plurality of central processing unit cores, said shared cache comprising a plurality of banks; and
   a BIST circuit coupled to said shared cache, wherein said BIST circuit comprises:
      a plurality of slave BIST controllers, each slave BIST controller associated with one of said plurality of banks and adapted to perform a test on one of said plurality of banks in response to a test instruction and to provide a resume signal at a conclusion of said test;
      a master BIST controller for issuing test instructions in response to a master resume signal; and
      a collector for receiving a corresponding resume signal from each of said plurality of slave BIST controllers after said master BIST controller issues said test instruction, and for subsequently providing said master resume signal in response to an activation of all of said corresponding resume signals.

15. The microprocessor of claim 14, wherein said plurality of slave BIST controllers is coupled to receive said instruction in a daisy chain configuration.

16. The microprocessor of claim 14, wherein said collector comprises:
   a plurality of sticky latches each having a data input for receiving said corresponding resume signal, and an output for providing a corresponding sticky resume signal;
   a logic gate having a plurality of inputs coupled to said outputs of said plurality of sticky latches, and an output for providing an unlatched master resume signal; and
   an output latch having a data input coupled to said output of said logic gate, and an output for providing said master resume signal.

17. The microprocessor of claim 16, wherein said logic gate comprises an AND gate.

18. The microprocessor of claim 16, wherein each of said plurality of sticky latches comprises:
   an OR gate having a first input for receiving said corresponding resume signal, a second input for receiving said corresponding sticky resume signal, and an output;
   an AND gate having a first input for receiving a complement of said unlatched master resume signal, a second input coupled to said output of said OR gate, and an output; and
   a resume latch having a data input coupled to said output of said AND gate, a clock input for receiving said scan clock signal, and an output for providing said sticky resume signal.

19. The microprocessor of claim 16, wherein each of said plurality of banks comprises a data array and a corresponding tag array.

20. The microprocessor of claim 16, wherein each of said plurality of central processing unit cores comprises a corresponding level one (L1) cache, and said shared cache comprises a level two (L2) cache.

21. A method of built in self test (BIST) comprising:
   issuing a test instruction from a master BIST controller;
   for each of a plurality of slave BIST controllers:
      performing a test indicated by said test instruction on an associated circuit;
      activating a resume signal at a completion of said test; and
      activating a sticky resume signal in response to said resume signal while at least one of said plurality of slave BIST controllers is still performing said test,
   activating a master resume signal to said master BIST controller in response to an activation of said sticky resume signal in all of said plurality of slave BIST controllers.

22. The method of claim 21 further comprising:
   deactivating all of said sticky resume signals in response to an activation of said master resume signal.

23. The method of claim 21 wherein said performing said test indicated by said test instruction on said associated circuit comprises, for at least one slave BIST controller, performing said test indicated by said test instruction on an data array of a cache.

24. The method of claim 21 wherein said performing said test indicated by said test instruction on said associated circuit comprises, for at least one slave BIST controller, performing said test indicated by said test instruction on tag array of a cache.

* * * * *